(12) United States Patent
Yonekawa et al.

(10) Patent No.: US 6,853,257 B2
(45) Date of Patent: Feb. 8, 2005

(54) PLL CIRCUIT INCLUDING A VOLTAGE CONTROLLED OSCILLATOR AND A METHOD FOR CONTROLLING A VOLTAGE CONTROLLED OSCILLATOR

(75) Inventors: Masayuki Yonekawa, Kasugai (JP); Takehito Doi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/443,105

(22) Filed: May 22, 2003

(65) Prior Publication Data

US 2003/0222726 A1 Dec. 4, 2003

(30) Foreign Application Priority Data

May 29, 2002 (JP) ........................................ 2002-155653

(51) Int. Cl.[7] .......................... H03L 7/099; H03L 7/10; H03B 5/12
(52) U.S. Cl. ..................... 331/17; 331/36 C; 331/36 L; 331/117 R; 331/177 V; 331/179; 331/181
(58) Field of Search ............................. 331/1 A, 8, 10, 331/11, 16–18, 25, 34, 36 R, 36 C, 36 L, 117 R, 117 FE, 117 D, 175, 177 R, 177 V, 179, 181

(56) References Cited

U.S. PATENT DOCUMENTS 6,496,075 B2 * 12/2002 Justice et al. ................. 331/11

FOREIGN PATENT DOCUMENTS

| JP | 05-199109 | 8/1993 |
| JP | 09-214335 | 8/1997 |
| JP | 11-308099 | 11/1999 |
| JP | 11-330960 | 11/1999 |

* cited by examiner

*Primary Examiner*—David Mis
(74) *Attorney, Agent, or Firm*—Arent Fox PLLC

(57) ABSTRACT

A voltage controlled oscillator having a wide oscillation frequency band, desirable carrier-noise characteristic, and desirable linearity of the oscillation frequency relative to a control voltage. The voltage controlled oscillator includes an oscillation unit and a control unit. The oscillation unit generates an output signal having an oscillation frequency corresponding to the control voltage in one of a plurality of oscillation frequency bands. The oscillation unit includes a switching unit for selecting one of the plurality of oscillation frequency bands in accordance with a switching signal. The control unit generates the switching signal in accordance with the control voltage.

6 Claims, 8 Drawing Sheets

PLL CIRCUIT INCLUDING A VOLTAGE CONTROLLED OSCILLATOR AND A METHOD FOR CONTROLLING A VOLTAGE CONTROLLED OSCILLATOR

CROSS-REFERENCE TO RELATED APPLICATION

This application is based upon and claims the benefit of priority from Japanese Patent Application No. 2002-155653, filed on May 29, 2002, the entire contents of which are incorporated herein by reference.

BACKGROUND OF THE INVENTION

The present invention relates to a voltage controlled oscillator used in a phase locked loop circuit.

In recent years, there is a demand for mobile communication devices, such as a cellular phone, being more compact, light, and inexpensive.

FIG. 1 illustrates a prior art voltage controlled oscillator (VCO) 50. Inductors 1a and 1b each have a first end supplied with power Vcc and a second end connected to variable capacitors 2a and 2b. A control voltage VT is supplied between the variable capacitors 2a and 2b. The capacitances of the variable capacitors 2a and 2b vary in accordance with the control voltage VT.

A fixed capacitor 3 and the variable capacitors 2a and 2b are connected in parallel between the inductors 1a and 1b. The collector of an NPN transistor Tr1 is connected to a second end of the inductor 1a. The collector of an NPN transistor Tr2 is connected to a second end of the inductor 1b.

The base of the transistor Tr1 is connected to the collector of the transistor Tr2. The base of the transistor Tr2 is connected to the collector of the transistor Tr1. The emitters of the transistors Tr1 and Tr2 are connected to a current source 4.

Complementary output signals OUT and XOUT are respectively output from the collectors of the transistors Tr1 and Tr2 as an output signal OUTVCO of the VCO 50.

The VCO 50 oscillates in accordance with the supply of power VCC. The frequency fVCO of the output signal OUTVCO of the VCO 50 is represented by the next equation.

$$fVCO = 1/2\pi\sqrt{LC}$$

In the equation, L represents the inductance values of the inductors 1a and 1b, and C represents the sum of the capacitances of the variable capacitors 2a and 2b and the fixed capacitor 3. When the capacitances of the variable capacitors 2a and 2b vary in accordance with the control voltage VT, the frequency fVCO of the output signal OUTVCO is varied.

When incorporating the VCO 50, the oscillation frequency band of the VCO 50 must be widened to widen the logic range band of the PLL circuit. However, as shown in FIG. 2, when widening the oscillation frequency band of the VCO 50, deterioration in carrier-noise (CN) characteristic and deterioration in the linearity of the oscillation frequency fVCO relative to changes in the control voltage VT occurs.

As shown in FIG. 3, when narrowing the oscillation frequency band of the VCO 50, deterioration of the CN characteristic and linearity is prevented. However, this narrows the logic range of the PLL circuit. Further, when the oscillation frequency band is not included in a predetermined range due to manufacturing differences, the margin for manufacturing differences may become small.

SUMMARY OF THE INVENTION

In one aspect of the present invention, a voltage controlled oscillator includes an oscillation unit which generates an output signal having an oscillation frequency corresponding to a control voltage in one of a plurality of oscillation frequency bands. The oscillation unit includes a switching unit which selects one of the plurality of oscillation frequency bands in accordance with a switching signal. A control unit is connected to the switching unit which generates the switching signal in accordance with the control voltage.

A further aspect of the present invention is a method for controlling a voltage controlled oscillator. The method includes generating an output signal having an oscillation frequency corresponding to a control voltage in one of a plurality of oscillation frequency bands, generating a switching signal in accordance with the control voltage, and selecting one of the plurality of oscillation frequency bands in accordance with the switching signal.

A further aspect of the present invention is a PLL circuit incorporating a voltage controlled oscillator including an oscillation unit which generates an output signal having an oscillation frequency corresponding to a control voltage in one of a plurality of oscillation frequency bands. The oscillation unit includes a switching unit which selects one of the plurality of oscillation frequency bands in accordance with a switching signal. A control unit is connected to the switching unit which generates the switching signal in accordance with the control voltage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
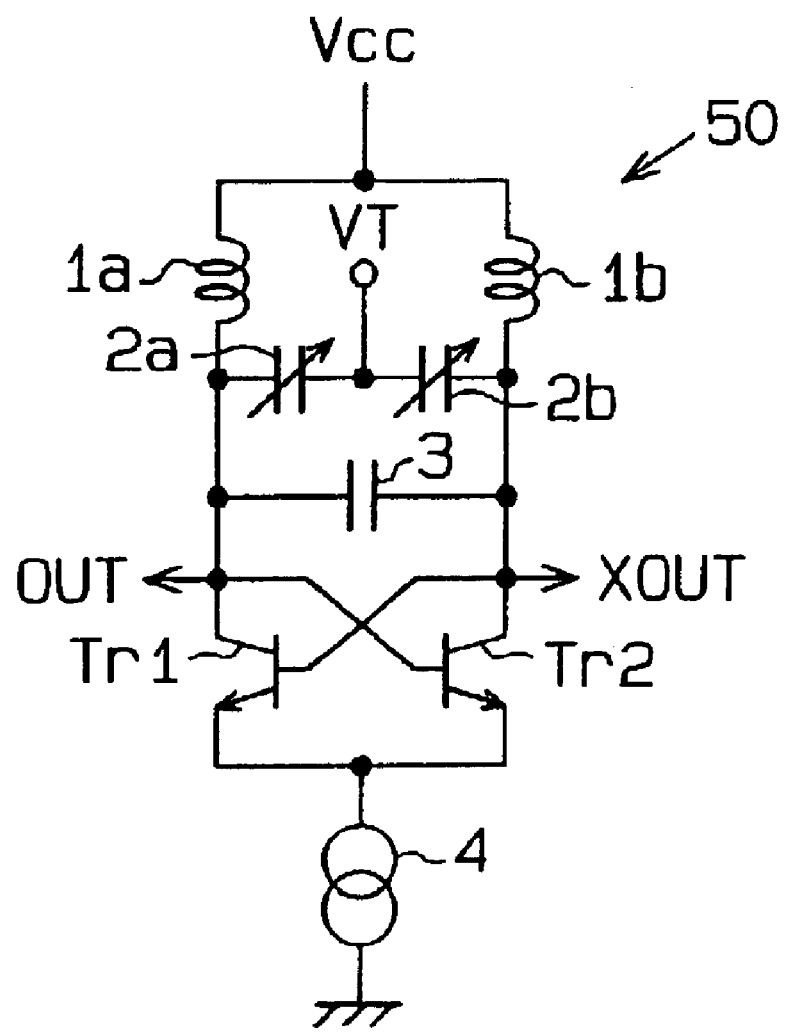
FIG. 1 is a schematic circuit diagram of a prior art voltage controlled oscillator.
Figure 2:
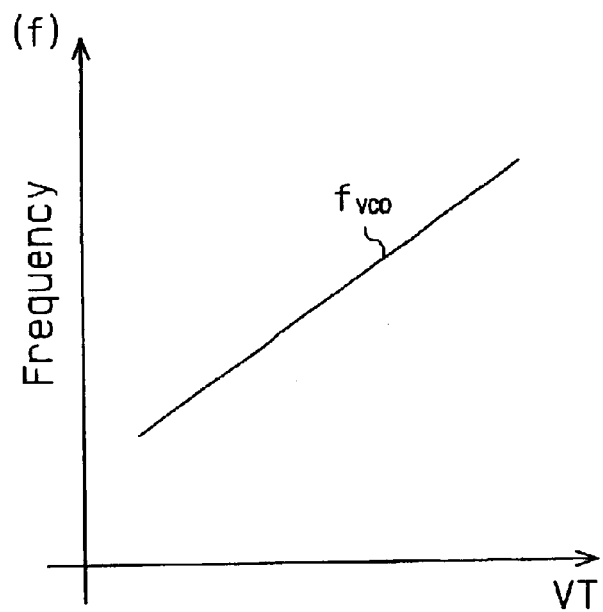
FIGS. 2 and 3 are graphs illustrating the operation of the voltage controlled oscillator of FIG. 1.
Figure 3:
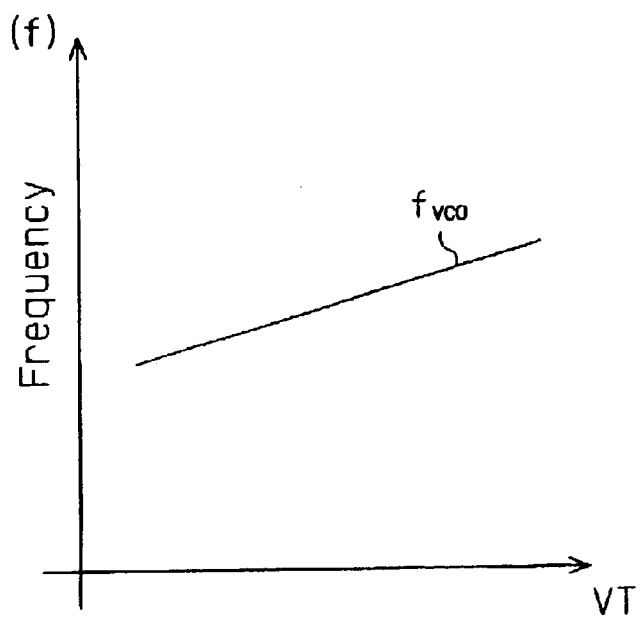

In the drawings, like numerals are used for like elements throughout.

Figure 4:
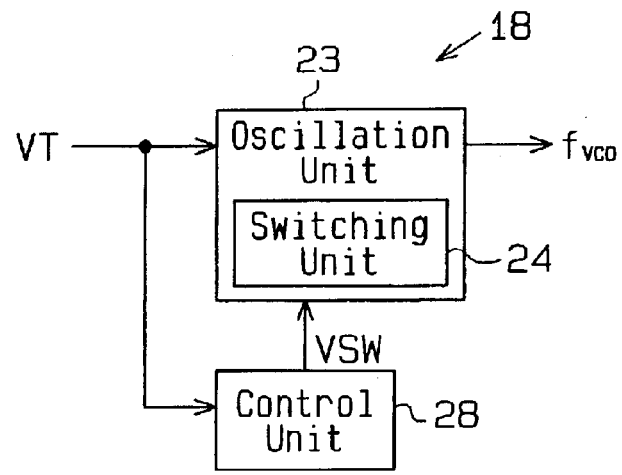
FIG. 4 is a schematic block diagram of a voltage controlled oscillator according to a preferred embodiment of the present invention.

FIG. 4 is a schematic block diagram of a VCO 18 according to a preferred embodiment of the present invention. The VCO 18 includes an oscillation unit 23 and a control unit 28. The oscillation unit 23 generates an output signal OUTVCO having a predetermined oscillation frequency fVCO in accordance with a control voltage VT. The oscillation unit 23 includes a switching unit 24 for selecting one of a plurality of oscillation frequency bands. The control unit 28 generates a switching signal VSW in accordance with the control voltage VT.

Figure 12:
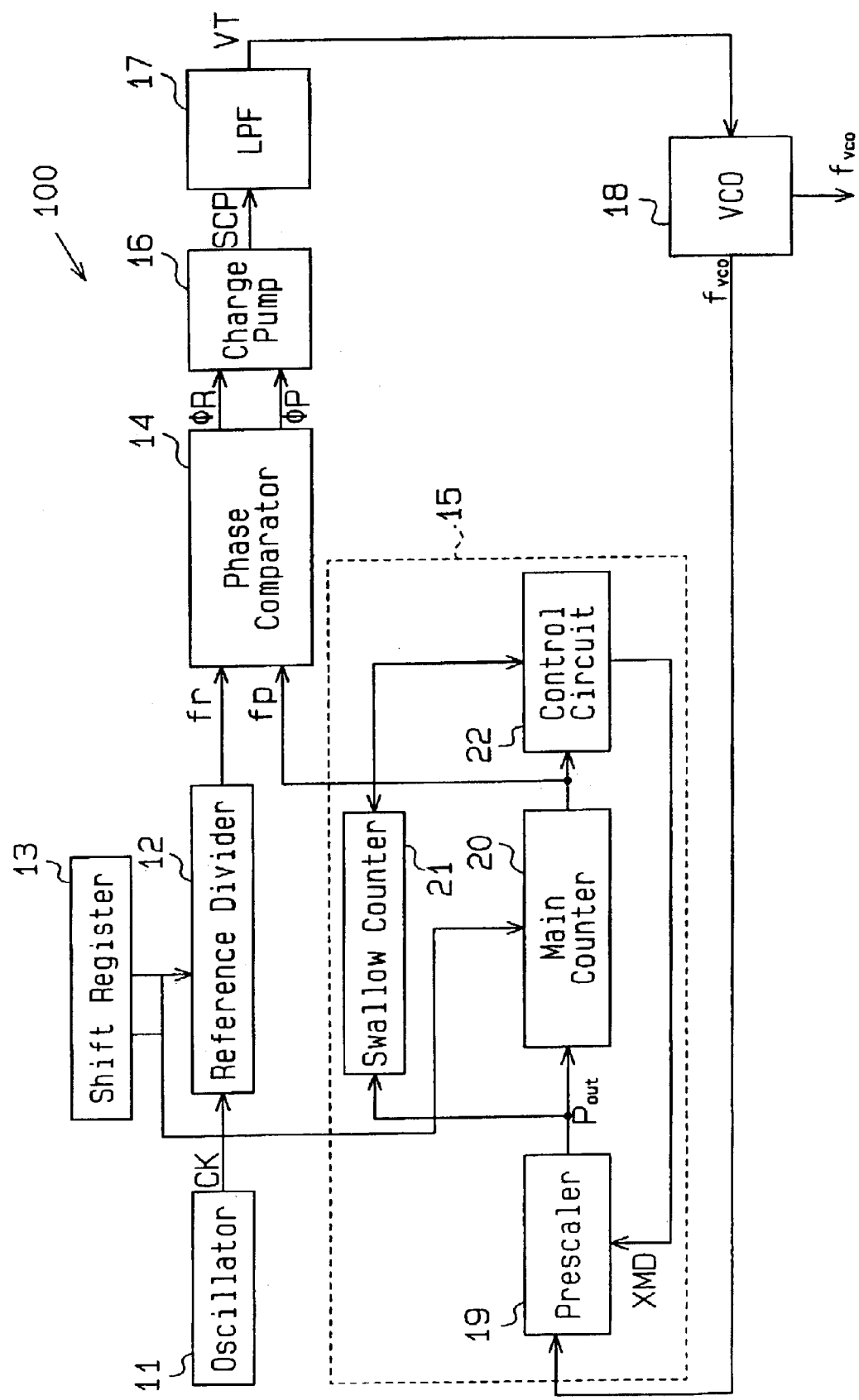
FIG. 12 is a schematic block diagram of a PLL circuit including the voltage controlled oscillator of FIG. 4.

FIG. 12 shows a PLL circuit 100 incorporating the VCO 18. The oscillator 11 generates a reference clock signal CK having an inherent frequency in accordance with the oscillation of a crystal oscillation element to generate a reference clock signal CK. The oscillator 11 then provides the reference clock signal CK to a reference divider 12. The reference divider 12 includes a counter circuit and divides the reference clock signal CK in accordance with a dividing ratio, which is set by a shift register 13, to generate a reference signal fr. The reference signal fr is provided to a phase comparator 14.

The phase comparator 14 receives a comparison signal fp from the comparison divider 15. The phase comparator 14 generates pulse signals ØR and ØP in accordance with the frequency difference and phase difference between the reference signal fr and the comparison signal fp and provides the pulse signals ØR and ØP to a charge pump 16. In accordance with the pulse signals ØR and ØP, the charge pump 16 generates an output signal SCP and provides the output signal SCP to a low pass filter (LPF) 17.

The output signal SCP includes DC components and pulse components. The DC component changes in accordance with the frequency fluctuations of the pulse signals ØR and ØP. The pulse component changes in accordance with the phase difference of the pulse signals ØR and ØP.

The LPF 17 smoothens the charge pump output signal SCP to eliminate high frequency components and generate a control voltage VT. The control voltage VT is supplied to the VCO 18. The VCO 18 generates a VCO output signal OUTVCO, which has a frequency fVCO corresponding to the control voltage VT, and provides the VCO output signal OUTVCO to an external circuit (not shown) and the comparison divider 15.

The comparison divider 15, which is of a pulse swallow type, includes a prescaler 19, a main counter 20, a swallow counter 21, and a control circuit 22. The prescaler 19 receives the VCO output signal OUTVCO and divides the frequency fVCO of the VCO output signal (hereafter, referred to as VCO frequency) OUTVCO by M or M+1 to generate a first divisional signal POUT. The first divisional signal POUT is provided to the main counter 20 and the swallow counter 21.

The swallow counter 21 further divides the first divisional signal POUT by A to generate a second divisional signal and provides the second divisional signal to the control circuit 22. In accordance with the second divisional signal, the control circuit 22 generates a modulus signal XMD having, for example, a low level and provides the modulus signal XMD to the prescaler 19. In accordance with the modulus signal XMD, the prescaler 19 divides the VCO frequency fVCO by M to generate the first divisional signal POUT.

While the swallow counter 21 generates an A number of pulses, the control circuit 22 generates the modulus signal XMD at, for example, a high level. In accordance with the high modulus signal XMD, the prescaler 19 divides the VCO frequency by M+1 to generate the first divisional signal Pout.

The shift register 13 sets the divisional ratio N of the main counter 20. The main counter 20 divides the first divisional signal Pout by N to generate a comparison signal fp and provides the comparison signal fp to the phase comparator 14. The comparison signal fp is also provided to the control circuit 22. Whenever the main counter 20 divides the first divisional signal POUT by N, the control circuit 22 generates an activation signal and provides the activation signal to the swallow counter 21. Accordingly, whenever the main counter 20 divides the first divisional signal Pout by N, the swallow counter 21 is activated to count the first divisional signal Pout.

The above series of operations locks the VCO frequency fVCO so that the frequencies and phases of the reference signal fr and the comparison signal fp are matched.

The VCO 18 will now be discussed in detail. The control voltage VT is supplied to the oscillation unit 23. Excluding the capacitor unit (switching unit) 24, the oscillation unit 23 is similar to the prior art VCO 50. The oscillation unit 23 includes inductors 1a and 1b and variable capacitors 2a and 2b, the capacitance of which varies in accordance with the control voltage VT.

Figure 7:
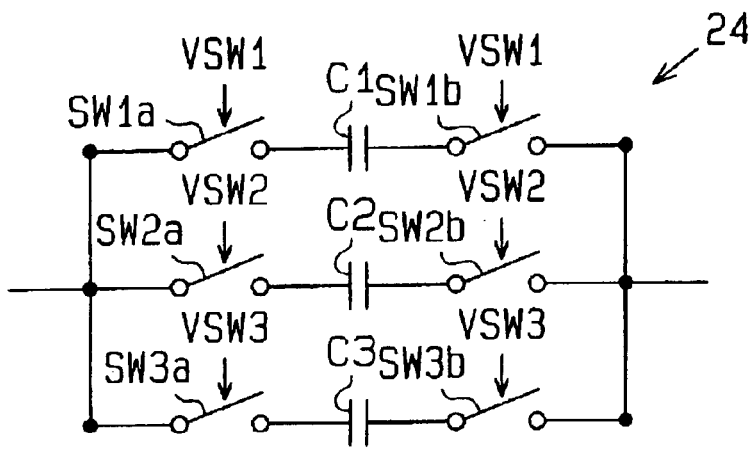
FIG. 7 is a circuit diagram of a switching unit in the oscillation unit.

Referring to FIG. 7, the switching unit 24 includes fixed capacitors C1 to C3 and switch circuits SW1 to SW3. In accordance with switching signals VSW1 to VSW3, the switch circuits SW1 to SW3 are selectively connected parallel to the variable capacitors 2a and 2b.

The switch circuit SW1 includes a first switch SW1a, which is connected to a first terminal of the fixed capacitor C1, and a second switch SW1b, which is connected to a second terminal of the fixed capacitor C1. The switch circuit SW2 includes a third switch SW2a, which is connected to a first terminal of the fixed capacitor C2, and a fourth switch SW2b, which is connected to a second terminal of the fixed capacitor C2. The switch circuit SW3 includes a fifth switch SW3a, which is connected to a first terminal of the fixed capacitor C3, and a sixth switch SW3b, which is connected to a second terminal of the fixed capacitor C3.

Each of the switch circuits SW1 to SW3 includes, for example, a transmission gate. The transmission gate includes a p-channel MOS transistor and an n-channel MOS transistor, which are connected parallel to each other. The switch circuits SW1 to SW3 are switched on when the associated switch control signals VSW1 to VSW3 go, for example, low and are switched off when the associated switch control signals VSW1 to VSW3 go high.

Accordingly, when all of the switch circuits SW1 to SW3 are switched off, the capacitance of the switching unit 24 is the sum of the capacitances of the capacitors C1 to C3. In this case, the transition of the VCO frequency fVCO in accordance with the control voltage VT is as shown by line A in FIG. 9. When the first and second switch circuits SW2 and SW3 are switched on, the capacitance of the switching unit 24 is the sum of the capacitors C2 and C3. In this case, the transition of the VCO frequency fVCO is as shown in line B in FIG. 9. When only the third switch circuit SW3 is switched on, the capacitance of the switching unit 24 is equal to the capacitance of the capacitor C3. In this case, the transition of the VCO frequency fVCO is as shown in line C in FIG. 9.

Figure 5:
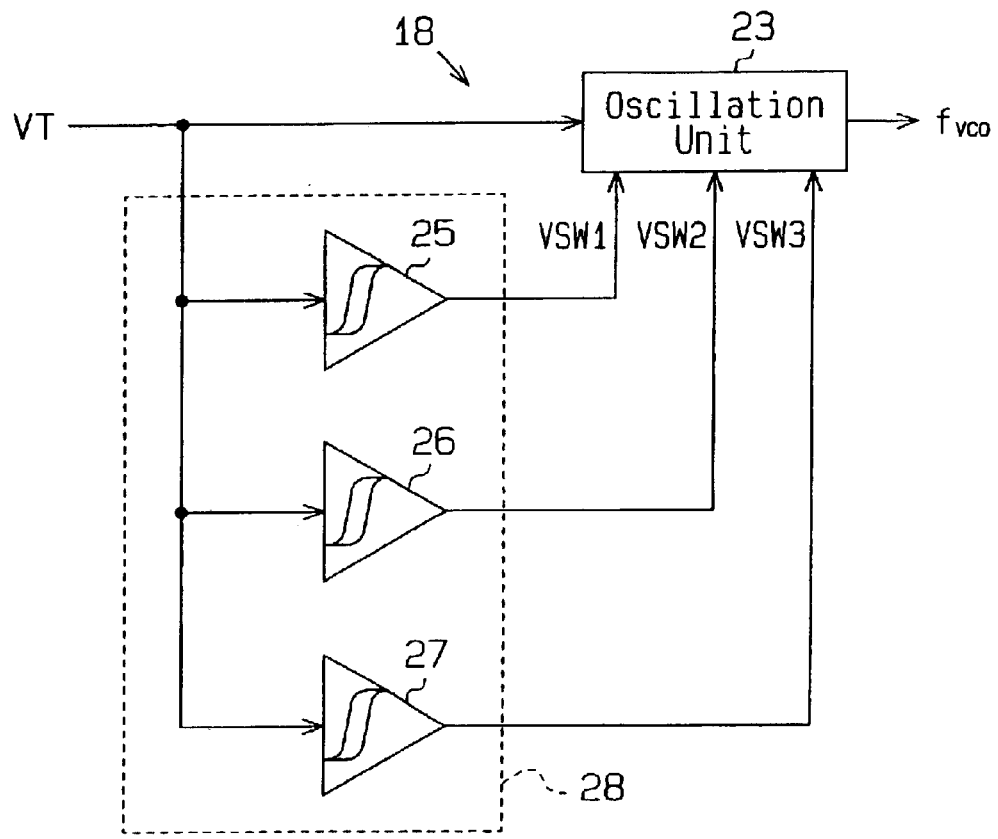
FIG. 5 is a schematic circuit diagram of the voltage controlled oscillator of FIG. 4.
Figure 6:
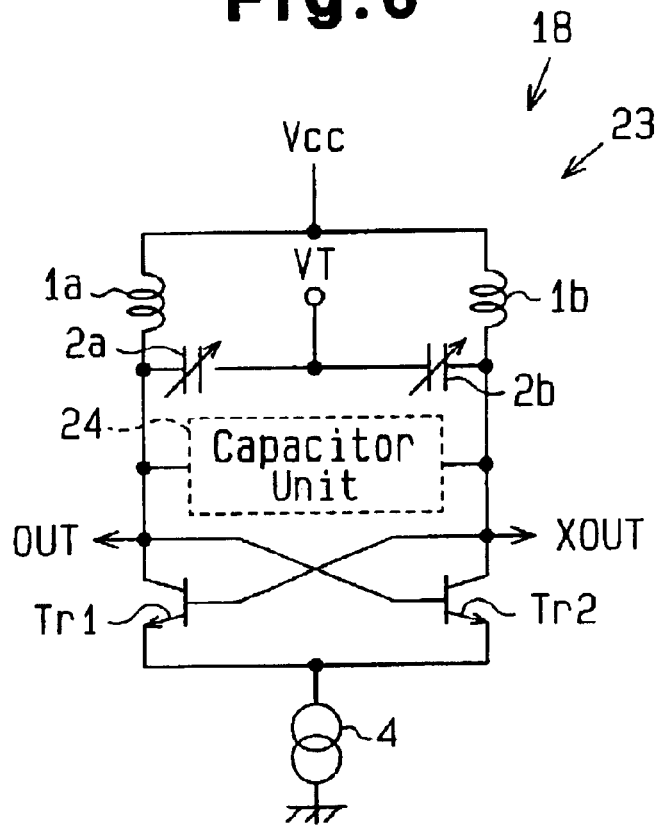
FIG. 6 is a schematic circuit diagram of an oscillation unit in the voltage controlled oscillator of FIG. 4.

Referring to FIG. 5, the control unit 28 includes comparators 25 to 27, and the comparators 25 to 27 respectively generate the switch control signals VSW1 to VSW3. The comparators 25 to 27 each receive the control voltage VT. The comparators 25 to 27 each have a hysteresis characteristic.

Figure 8A:
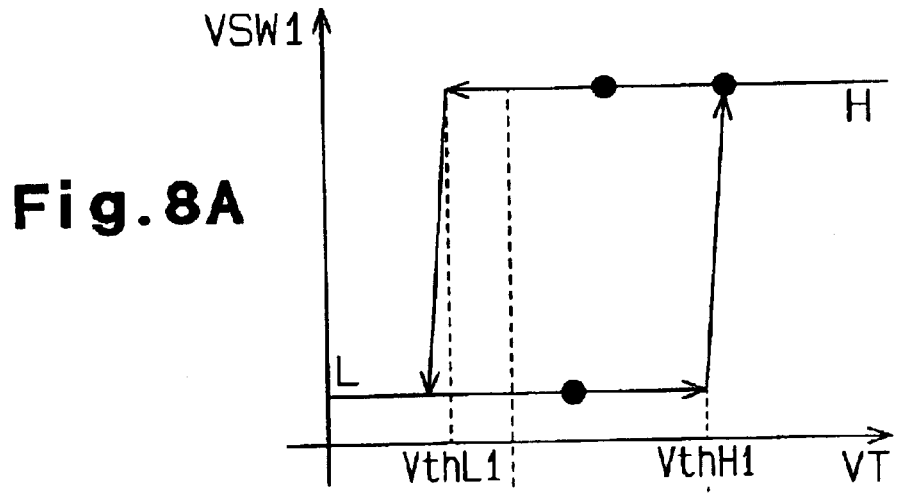
FIGS. 8A to 8C are graphs showing the operation of a comparator in the voltage controlled oscillator of FIG. 4.

Referring to FIG. 8A, the hysteresis characteristic of the comparator 25 includes a rising threshold value VthH1 and a trailing threshold value VthL1. If the control voltage VT exceeds the threshold value VthH1 when the switch control signal VSW1 is low, the switch control signal VSW1 goes high. If the control voltage VT becomes lower than the threshold value VthL1 when the switch control signal VSW1 is high, the switch control signal VSW1 goes low.

Figure 8B:
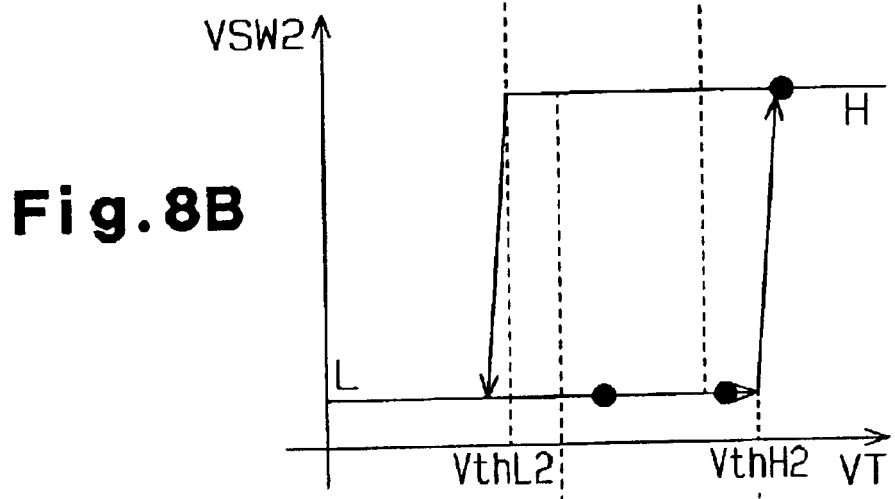

Referring to FIG. 8B, the comparator 26 operates in the same manner as the comparator 25 in accordance with the rising threshold value VthH2 and the trailing threshold value VthL2. The threshold value VthH2 is greater than the threshold value VthH1, and the threshold value VthL2 is greater than the threshold value VthL1.

Figure 8C:
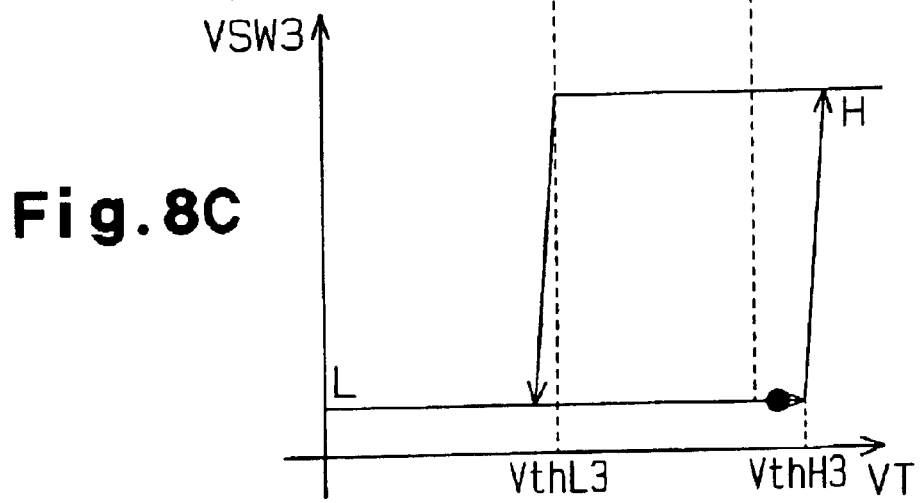

Referring to FIG. 8C, the comparator 27 operates in the same manner as the comparator 25 in accordance with the rising threshold value VthH3 and the trailing threshold value VthL3. The threshold value VthH3 is greater than the threshold value VthH3, and the threshold value VthL3 is greater than the threshold value VthL2.

The operation of the VCO 18 will now be discussed. When the PLL circuit 100 is activated, if the control voltage VT increases from a level lower than the threshold value VthL1 of the comparator 25, the switch control signals VSW1 to VSW3 remain low until the control voltage VT exceeds the threshold value VthH1. Accordingly, the oscillation unit 23 operates in a band (hereafter referred to as band A) defined by line A in FIG. 9.

Figure 9:
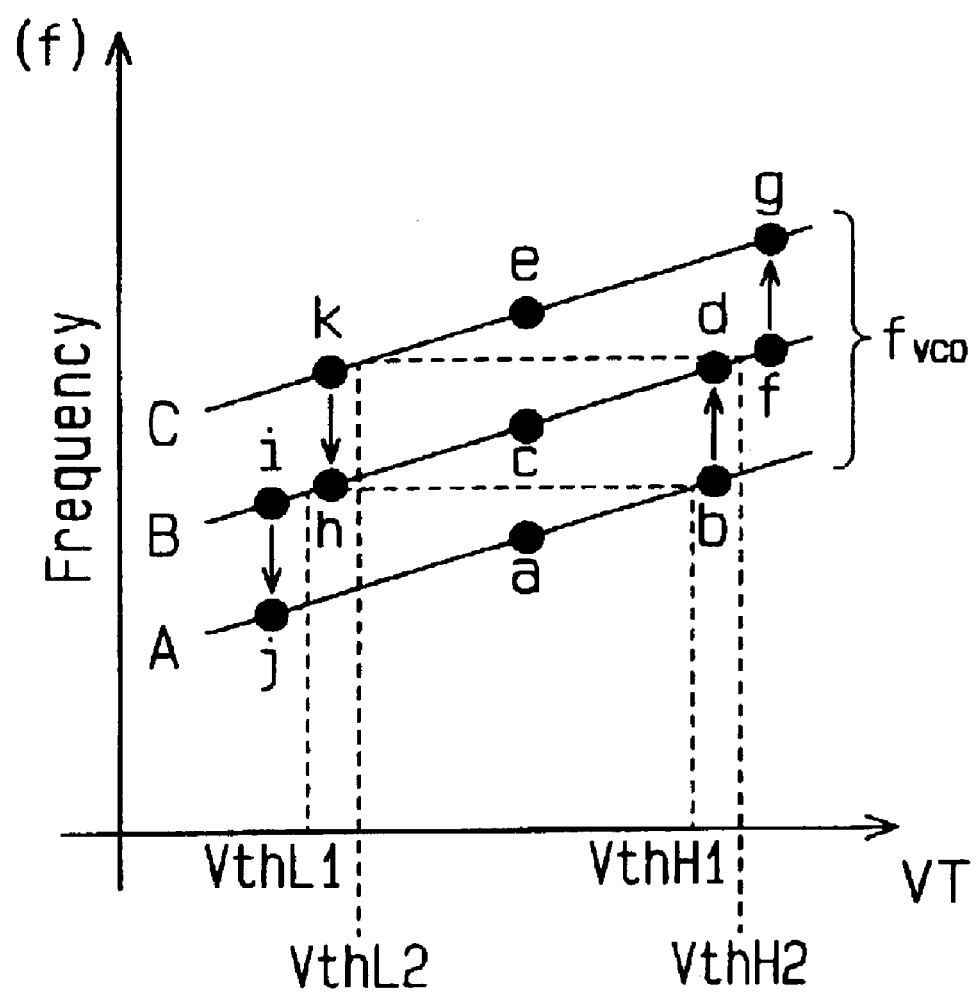
FIG. 9 is a graph showing the operation of the voltage controlled oscillator of FIG. 4.

In this case, for example, at point a in FIG. 9, the control voltage VT does not exceed the threshold value VthH1 of the comparator 25. Thus, the oscillation unit 23 operates in band A as long as the VCO frequency fVCO is converged and locked.

The control voltage VT is increased to shift the lock setting frequency of the PLL circuit 100 from point a to point c. When the control voltage VT exceeds the threshold value VthH1 of the comparator 25, the switch control signal VSW1 goes high. This switches off the switch circuit W1 and decreases the capacitance of the switching unit 24. Thus, the VCO frequency fVCO shifts from point b in band A to point d in band B. The control voltage VT is decreased to converge the VCO frequency fVCO at point c. The switch control signal VSW1 remains high until the control voltage VT becomes lower than the threshold value VthL1 of the comparator 25. Thus, the oscillation unit 23 is operated in band B.

To shift the lock setting frequency of the PLL circuit 100 to point e from this state, the control voltage VT is increased. When the control voltage VT exceeds the threshold value VthH2 of the comparator 26, the switch control signal VSW2 goes high. This switches off the switch circuit SW2 and equalizes the capacitance of the switching unit 24 with the capacitance of the capacitor C3. Thus, the VCO frequency fVCO shifts from point f in band B to point g in band C. The control voltage VT is decreased to converge the VCO frequency fVCO at point e. The switch control signal VSW2 remains high until the control voltage VT becomes lower than the threshold value VthL2 of the comparator 26. Thus, the oscillation unit 23 is operated in band C.

When the lock setting frequency shifts from point e back to point c, the control voltage VT is decreased. When the control voltage VT becomes lower than the threshold value VthL2, the switch control signal VSW2 goes low, and the switch circuit SW2 is switched on. This adds the capacitance C2 to the capacitance C3 and the oscillation unit 23 shifts the VCO frequency fVCO to point h. The control voltage VT is increased to converge the VCO frequency fVCO at point c. When the lock setting frequency shifts from point c back to point a, the VCO frequency fVCO is shifted from band B to band A.

(1) In accordance with the frequency band, the VCO 18 automatically selects the frequency band from one of A, B, and C bands and converges the VCO frequency fVCO to the lock setting frequency.

(2) Bands A, B, and C narrow the frequency band of the VCO 18. This improves the CN characteristic and linearity of the VCO signal OUTVCO relative to the control voltage VT.

(3) Bands A, B, and C are automatically switched to widen the frequency band of the VCO 18. A margin for manufacturing differences is easily obtained by the widened the logic range of the PLL circuit 100.

(4) The comparators 25 to 27 each have a hysteresis characteristic and the associated A, B, and C bands are overlapped with one another. This easily switches the frequency band.

It should be apparent to those skilled in the art that the present invention may be embodied in many other specific forms without departing from the spirit or scope of the invention. Particularly, it should be understood that the present invention may be embodied in the following forms.

In the switching unit (capacitor unit) 24, the number of capacitors C connected in parallel is not limited. An increase in the number of the capacitors C enables the oscillation frequency band of the VCO to be divided into further narrow bands while widening the entire frequency band.

Figure 10:
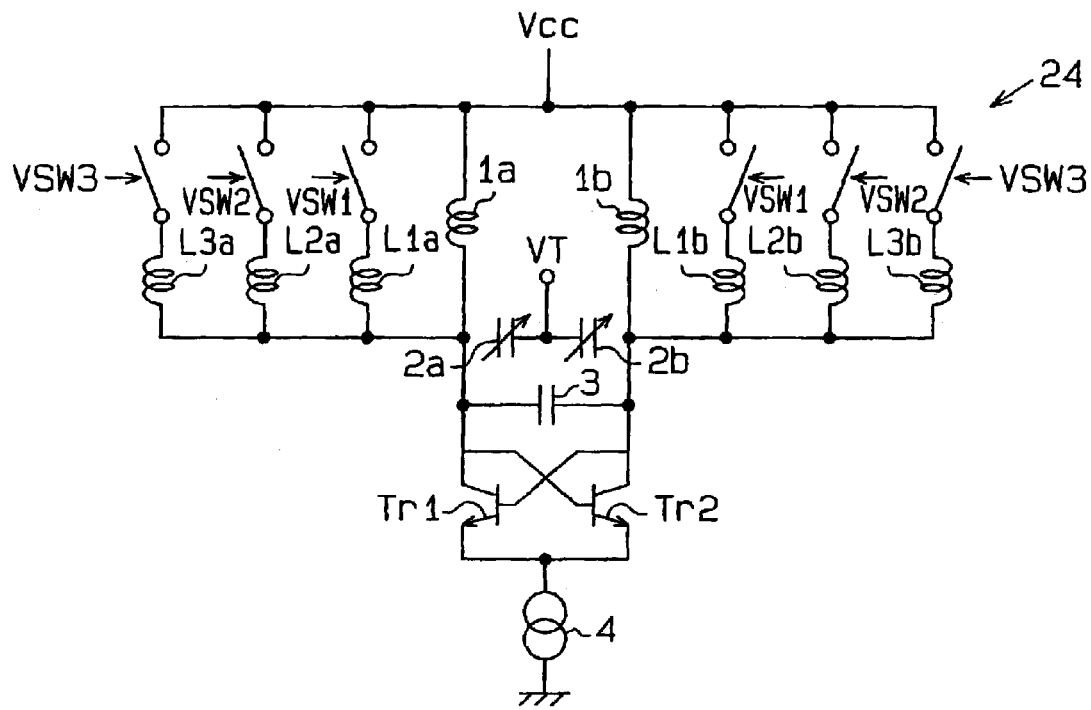
FIG. 10 is a schematic circuit diagram of a further oscillation unit.

Referring to FIG. 10, the number of inductors (L1a to L3b) may be changed by the switch control signals VSW1 to VSW3 to switch the VCO oscillation frequency band.

Figure 11:
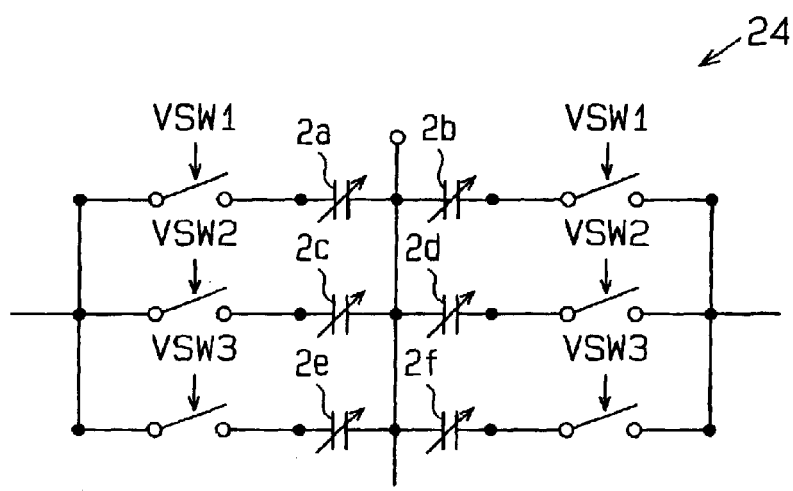
FIG. 11 is a circuit diagram of a further switching unit.

Referring to FIG. 11, the connection of variable capacitors (2a to 2f) may be switched by the switch control signals VSW1 to VSW3.

The present examples and embodiments are to be considered as illustrative and not restrictive, and the invention is not to be limited to the details given herein, but may be modified within the scope and equivalence of the appended claims.

What is claimed is:

1. A voltage controlled oscillator comprising:
   an oscillation unit which generates an output signal having an oscillation frequency corresponding to a control voltage in one of a plurality of oscillation frequency bands, wherein the oscillation unit includes:
   a fixed inductor;
   a variable capacitor connected to the fixed inductor and having a capacitance varied in accordance with the control voltage; and
   a fixed capacitor connected in parallel with the variable capacitor;
   a plurality of additional inductors;
   a plurality of switch circuits connected to the additional inductors to selectively connect the additional inductors in parallel with the fixed inductor in accordance with a switching signal; and
   a control unit connected to the switch circuits which generates the switching signal in accordance with the control voltage.

2. The voltage controlled oscillator according to claim 1, wherein the control unit includes a plurality of comparators having different threshold values.

3. The voltage controlled oscillator according to claim 2, wherein each of the comparators has a hysteresis characteristic, in which a rising threshold value is greater than a trailing threshold value.

4. A method for controlling a voltage controlled oscillator, wherein the voltage controlled oscillator includes a fixed inductor and a plurality of additional inductors, the method comprising:

generating an output signal having an oscillation frequency corresponding to a control voltage in one of a plurality of oscillation frequency bands;

generating a switching signal in accordance with the control voltage; and selectively connecting the additional inductors in parallel with the fixed inductor in accordance with the switching signal.

5. The method according to claim 4, wherein the voltage controlled oscillator includes a variable capacitor connected to the fixed inductor and has a capacitance varied in accordance with the control voltage, and a fixed capacitor connected to the variable capacitor, the method further comprising:

setting the oscillation frequency band in accordance with the fixed inductor, the variable capacitor, the fixed capacitor, and at least one of the additional inductors.

6. A PLL circuit comprising:

a voltage controlled oscillator including:

an oscillation unit which generates an output signal having an oscillation frequency corresponding to a control voltage in one of a plurality of oscillation frequency bands, wherein the oscillation unit includes:

a fixed inductor;

a variable capacitor connected to the fixed inductor and having a capacitance varied in accordance with the control voltage; and a fixed capacitor connected in parallel with the variable capacitor;

a plurality of additional inductors;

a plurality of switch circuits connected to the additional inductors to selectively connect the additional inductors in parallel with the fixed inductor in accordance with a switching signal; and a control unit connected to the switching unit which generates the switching signal in accordance with the control voltage.

* * * * *